US006025076A

United States Patent [19]

Collins

[11] Patent Number: 6,025,076

[45] Date of Patent: Feb. 15, 2000

[54] DIAMOND-CONTAINING BODY

[76] Inventor: John Lloyd Collins, 18 Rutland Park Gardens, Willesden Green, London, United Kingdom

[21] Appl. No.: 09/024,154

[22] Filed: Feb. 17, 1998

[30] Foreign Application Priority Data

Feb. 20, 1997 [GB] United Kingdom ................... 9703571

[51] Int. Cl.[7] ........................................................ B32B 7/02

[52] U.S. Cl. ............................ 428/408; 428/698; 51/307; 51/309

[58] Field of Search .................................... 428/698, 408; 51/307, 309

[56] References Cited

U.S. PATENT DOCUMENTS

| | | | |
|---|---|---|---|
| 4,255,165 | 3/1981 | Dennis et al. | 51/309 |
| 4,629,373 | 12/1986 | Hall | 51/309 |
| 4,716,975 | 1/1988 | Dennis | 175/329 |
| 4,764,434 | 8/1988 | Aronsson et al. | 428/698 |
| 4,784,023 | 11/1988 | Dennis | 76/108 A |
| 4,972,637 | 11/1990 | Dyer | 451/295 |
| 5,007,207 | 4/1991 | Phaal | 51/204 |
| 5,054,246 | 10/1991 | Phaal et al. | 51/309 |
| 5,120,327 | 6/1992 | Dennis | 51/293 |
| 5,472,376 | 12/1995 | Olmstead et al. | 51/307 |
| 5,558,789 | 9/1996 | Singh | 219/121.69 |
| 5,776,355 | 7/1998 | Martin | 216/52 |

*Primary Examiner*—Archene Turner
*Attorney, Agent, or Firm*—Oblon, Spivak, McClelland, Maier & Neustadt, P.C.

[57] ABSTRACT

A diamond-containing body is provided which is useful particularly as a tool insert. The body comprises a layer of CVD diamond presenting a working surface defining a cutting edge. The layer of CVD diamond is bonded to a substrate along an interface. A pattern of spaced, curved grooves extends from the interface into the substrate up to a depth of 200 microns and extends across substantially the whole of the interface.

9 Claims, 2 Drawing Sheets

DIAMOND-CONTAINING BODY

BACKGROUND OF THE INVENTION

1. Field of the Invention

This invention relates to a diamond-containing body and more particularly such a body wherein the diamond is produced by chemical vapour deposition (hereinafter referred to as "CVD").

2. Discussion of the Background

Methods of depositing material such as diamond on a substrate by CVD are now well established and have been described extensively in the patent and other literature. Where diamond is being deposited on a substrate, the method generally involves providing a gas mixture which, on dissociation, can provide hydrogen or a halogen (e.g. F,Cl) in atomic form and C or carbon containing radicals and other reactive species (e.g. $CH_x$, $CF_x$ wherein x can be 1 to 4). In addition oxygen containing sources may be present, as may sources for nitrogen, and for boron. In many processes inert gases such as helium, neon or argon are also present. Thus, a typical source gas mixture will contain hydrocarbons $C_xY_y$ wherein x and y can each be from 1 to 10 (e.g. $CH_4$), halocarbons $C_xY_yhal_z$ wherein x and y can each be from 1 to 10 and z can be from 1 to 3, or $CO_x$, wherein x can be from 1 to 3, and optionally one or more of the following: $O_2$, $H_2$, $N_2$, $NH_3$, $B_2H_6$, and an inert gas. Each gas may be present in its natural isotopic ratio, or the relative isotopic ratios may be artificially controlled. For example, hydrogen may be present as deuterium or tritium, and carbon may be present as $^{12}C$ or $^{13}C$. Dissociation of the source gas mixture is brought about by an energy source such as microwaves, lasers, RF energy, a flame, or a hot filament, and the reactive gas species so produced are allowed to deposit on to a substrate and form diamond.

Layers of CVD diamond have been proposed as inserts for abrasive tools, particularly cutting tools. CVD diamond layers have found limited commercial favour for such applications. There are several reasons for this. First, CVD diamond, as with other diamond, is not easily brazeable to a tool holder. Second, when CVD diamond layers are bonded to cemented carbide substrates to improve the brazeability thereof, they tend to laminate or flake in use and this is unacceptable.

SUMMARY OF THE INVENTION

According to the present invention, a diamond-containing body, particularly one for use as a tool insert, comprises a layer of CVD diamond presenting a working surface defining a cutting edge, surface or point and bonded to a substrate along an interface, and a pattern of spaced, curved grooves extending from the interface into the substrate up to a depth of 200 microns and extending across substantially the whole of the interface.

Further according to the invention, a method of producing a diamond-containing body includes the steps of providing a substrate having a substantially flat surface, forming a pattern of spaced, curved grooves in the surface, such grooves having a depth of up to 200 microns and extending substantially across the whole of the surface, depositing a layer of diamond by chemical vapour deposition on the grooved surface such that the diamond fills the grooves and a layer of diamond above the grooves is created.

The pattern of spaced, curved grooves may be provided by a plurality of concentric grooves, or take the form of a spiral.

It is preferred that the pitch of successive grooves is such as to produce a surface roughness, $R_a$, of greater than 30 microns. Such surface roughness may be achieved by a pitch of less than 1 mm and typically in the range 0,02 to 0,5 mm. The pitch is defined as the distance between the centers of successive grooves.

The depth of each groove must be less than 200 microns and will typically be in the range 10 to 120 microns.

The CVD diamond layer will typically extend to a height of up to 5 mm above the interface. That CVD diamond layer has an upper surface which will provide a cutting edge, surface or point.

The provision of grooves as defined above provides excellent mechanical locking or bonding of the CVD diamond layer to the substrate. The bonding can be improved by chemically treating the grooved surface thereby enhancing the micro-roughening of that surface.

The substrate will typically be a cemented carbide, for example, cemented tungsten carbide. Other suitable substrate materials include silicon carbide and nitrides such as silicon nitride.

It is preferred that the grooved surface is chemically treated to enhance the micro-roughening of that surface prior to depositing the CVD diamond layer thereon. An example of suitable chemical treatment is etching with a strong inorganic acid such as nitric acid following by decarburization of the etched surface. An example of a suitable decarburizing solution is boiling Murakami's solution.

The grooves will typically be made by laser cutting, by moulding, by milling or by turning.

The CVD diamond layer may be any known in the art and may be diamond itself or boron-doped diamond. Boron-doped diamond has the advantage that it is EDM cuttable.

Methods of depositing a CVD diamond layer on a substrate are well known and documented in the art and any of these methods may be used.

The diamond-containing body of the invention may be used as, or as part of, a tool insert for drilling, cutting, milling and the like.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
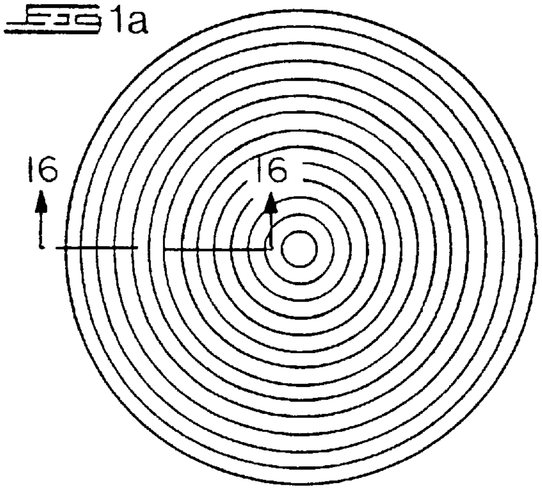
FIGS. 1*a* and 2*a* are plan views of embodiments of grooved substrates useful in the invention.

Embodiments of the invention will now be described with reference to the accompanying drawings. Referring to FIGS. 1 and 2, these drawings illustrate substrates useful in producing diamond-containing bodies of the invention. Each of these substrates is disc-shaped and has a base surface 10, an upper surface 12, and a pattern of curved grooves 14 extending into the substrate from the surface 12. In the embodiment of FIG. 1, a plurality of concentric grooves is provided. In the embodiment of FIG. 2, the grooves are in the form of a spiral.

Figure 1B:
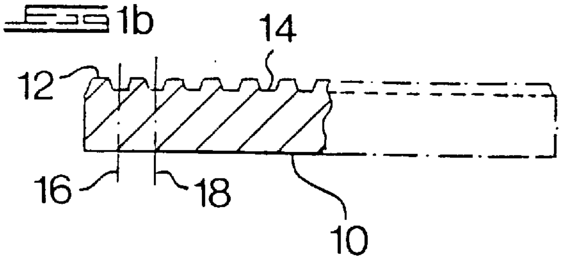
FIGS. 1*b* and 2*b* are sectional views taken along line 1*b*—1*b* and 2*b*—1*b*, respectively through portions of the substrates of FIGS. 1*a* and 2*a* (with the grooves exaggerated)
Figure 2A:
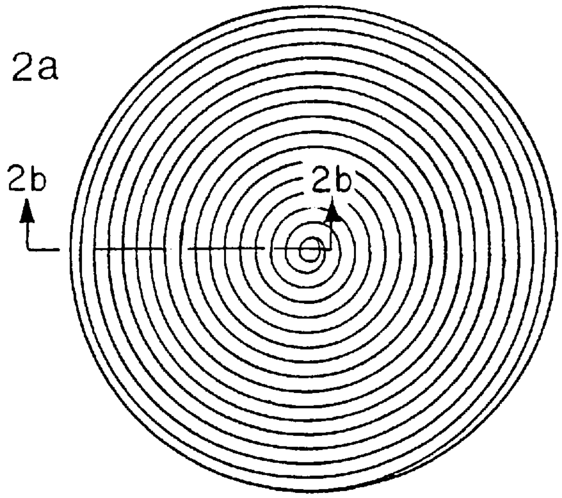
Figure 2B:
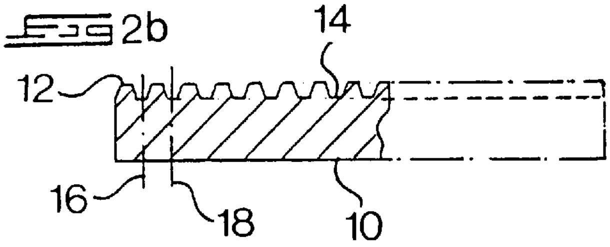

The depth of the groove, as shown in FIGS. 1*b* and 2*b* will be less than 200 m microns and typically are in the range of 10 to 120 microns. The pitch of the grooves, i.e. the distance between successive grooves, and as shown between the lines 16, 18, will typically be 0.2 to 0.5 mm. This pitch provides a surface roughness which is capable of creating effective bonding or a locking medium for the CVD diamond layer to be deposited thereon.

A CVD diamond layer may be deposited on the substrates illustrated by FIGS. 1 and 2 by methods known in the art. The deposition will take place on the surface 12. A thin layer of CVD diamond will first form and this will follow the contour of the grooved surface 12. Deposition will continue until the grooves 14 are all filled with diamond and will continue until a diamond layer extending above the surface 12 is created of a suitable depth. This depth will vary according to the nature of the application to which the diamond-containing body is to be put, but will generally be up to 5 mm.

Figure 4:
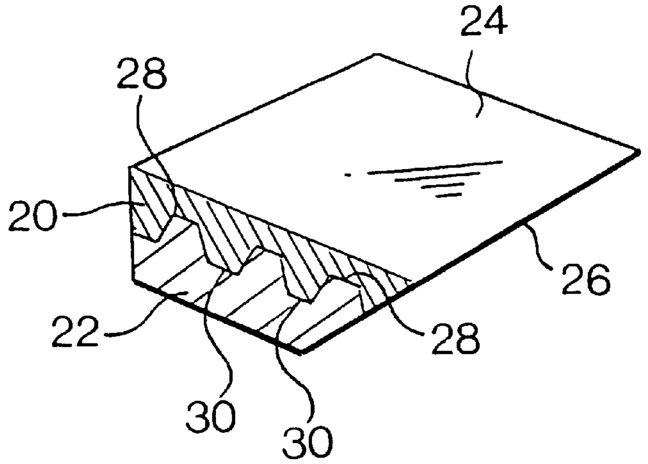
FIG. 4 is a perspective view of an embodiment of a tool insert of the invention.

A tool insert, as illustrated by FIG. 4, may be cut from the diamond-containing body thus produced. If the CVD diamond layer is conductive, e.g. is boron-doped, then EDM-cutting may be used. The tool insert comprises a CVD diamond layer 20 bonded to a substrate 22. The CVD diamond layer has an upper working surface 24 which presents an elongate cutting edge 26. Bonding of the CVD diamond layer to the substrate takes place along interface 28 which is grooved. Grooves 30 extend from the interface 28 into the substrate 22. Thus, the interface 28 and the grooves 30 together form a castellated interface.

Figure 3:
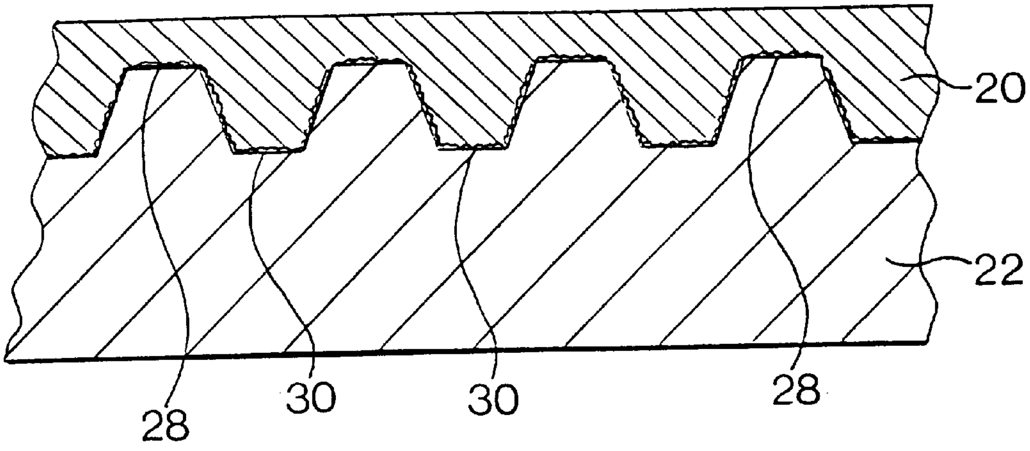
FIG. 3 is a section through an embodiment of a diamond-containing body of the invention.

It has been found that the castellated interface provides an excellent locking or bonding medium for the CVD diamond layer. This locking or bonding may be improved by chemically treating the interface surface thereby enhancing the micro-roughening of the interface, as shown diagrammatically by FIG. 3, where the castellated interface is shown micro-roughened by chemical treatment. When the substrate is a cemented carbide such as cemented tungsten carbide substrate, having cobalt as the bonding matrix, suitable chemical treatment is by means of nitric acid etching followed by decarburization of the thus etched surface.

We claim:

1. A diamond-containing body comprises a layer of CVD diamond presenting a working surface defining a cutting edge, surface or point and bonded to a substrate along an interface, and a pattern of spaced, curved grooves extending into the substrate, said grooves extending from the interface into the substrate up to a depth of 200 microns and extending across substantially the whole of the interface, wherein the grooves are in the form of one of a spiral groove and a plurality of concentric grooves.

2. A diamond-containing body according to claim 1 wherein the distance between the centers of successive grooves is less than 1 mm.

3. A diamond-containing body according to claim 1, wherein the distance between the centers of successive grooves is in a range of from 0.02 to 0.5 mm.

4. A diamond-containing body according to claim 1 wherein the depth of each groove is in a range of from 10 to 120 microns.

5. A diamond-containing body according to claim 1 wherein the CVD diamond layer extends to a height of up to 5 mm from the interface.

6. A diamond-containing body according to claim 1 wherein the substrate is selected from a carbide and a nitride.

7. A diamond-containing body according to claim 6 wherein the substrate is a cemented carbide substrate.

8. A diamond-containing body according to claim 7 wherein the cemented carbide substrate is a cemented tungsten carbide substrate.

9. A tool insert comprising a diamond-containing body according to claim 1.

* * * * *